(12) United States Patent
JangJian et al.

(10) Patent No.: US 9,520,424 B2
(45) Date of Patent: Dec. 13, 2016

(54) BLACK LEVEL CORRECTION (BLC) STRUCTURE

(71) Applicant: Taiwan Semiconductor Manufacturing Company Limited, Hsin-Chu (TW)

(72) Inventors: Shiu-Ko JangJian, Tainan (TW); Chi-Cherng Jeng, Tainan County (TW); Volume Chien, Sinying (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/663,108

(22) Filed: Oct. 29, 2012

(65) Prior Publication Data

US 2014/0117483 A1 May 1, 2014

(51) Int. Cl.
*H01L 27/146* (2006.01)
*G02F 1/1362* (2006.01)

(52) U.S. Cl.
CPC ... *H01L 27/14609* (2013.01); *G02F 1/136209* (2013.01); *H01L 27/14623* (2013.01); *H01L 27/14645* (2013.01)

(58) Field of Classification Search
CPC ............ H01L 27/146; H01L 27/14601; H01L 27/14623; H01L 27/3244–27/3297; H01L 29/78633; H01L 31/02164; G02F 1/136209; G02F 1/133512; G02F 1/0009–1/1347

(Continued)

(56) References Cited

U.S. PATENT DOCUMENTS 6,034,725 A * 3/2000 Franklin et al. ............... 348/310
6,500,678 B1 * 12/2002 Aggarwal ............... C23C 14/08
257/E21.009

(Continued)

FOREIGN PATENT DOCUMENTS

KR   1020030000649 A   6/2003
WO      2008/033697 A2   3/2008

OTHER PUBLICATIONS

Tamagawa, T. et al. Properties of Piezoelectric Thin Films for Micromechanical Devices and Systems. IEEE Micro Electro Mechanical Systems Workshop, Jan.-Feb. 1991, Nara, Japan, p. 118.*

(Continued)

*Primary Examiner* — Eric Ward
*Assistant Examiner* — Eric Ashbahian
(74) *Attorney, Agent, or Firm* — Cooper Legal Group, LLC

(57) ABSTRACT

One or more techniques or systems for forming a black level correction (BLC) structure are provided herein. In some embodiments, the BLC structure comprises a first region, a second region above at least some of the first region, and a third region above at least some of the second region. For example, the first region comprises silicon and the third region comprises a passivation dielectric. In some embodiments, the second region comprises a first sub-region, a second sub-region above the first sub-region, and a third sub-region above the second sub-region. For example, the first sub-region comprises a metal-silicide, the second sub-region comprises a metal, and the third sub-region comprises a metal-oxide. In this manner, a BLC structure is provided, such that a surface of the BLC structure is flush, at least because the third region is flush, for example.

20 Claims, 10 Drawing Sheets

(58) Field of Classification Search
USPC ....... 257/291, 292, 414, 257, 225, 222, 184, 257/80, 21, 53, 431–466; 250/239, 208.1, 250/200; 349/110, 111; 136/243–265; 348/294–331, 207.99
See application file for complete search history.

(56) References Cited

U.S. PATENT DOCUMENTS

| | | |
|---|---|---|
| 8,378,399 B2 | 2/2013 | Maeda |
| 2003/0169380 A1* | 9/2003 | Arao .................... G02F 1/1396 349/43 |
| 2009/0159943 A1* | 6/2009 | Jun .............................. 257/292 |
| 2010/0038523 A1* | 2/2010 | Venezia et al. ............... 250/216 |
| 2011/0272765 A1* | 11/2011 | Seo ...................... H01L 23/485 257/410 |
| 2012/0205730 A1* | 8/2012 | Chen et al. ................... 257/292 |

OTHER PUBLICATIONS

Koren Notice of Allowance cited in Korean Application No. 10-2013-0000655 dated Jul. 29, 2014, 3 pgs.
Taiwan Office action dated Mar. 4, 2015, 6 pages.

* cited by examiner

BLACK LEVEL CORRECTION (BLC) STRUCTURE

BACKGROUND

Generally, an image sensor, such as a complementary metal-oxide-semiconductor (CMOS) image sensor (CIS), comprises a structure associated with black level correction (BLC). For example, a BLC structure facilitates determination of a baseline for a CIS. However, such structures are generally associated with a step up height or a non-uniform thickness, at least because the structures are not flush with a surface of the CIS, for example. Additionally, a traditional BLC structure is associated with a thick metal layer, thus increasing the step up height of the BLC structure. Additionally, the step up height is often associated with a negative impact on color filter processes for the CIS. For example, light entering a first portion of the CIS is associated with a first signal and the same light entering a second portion of the CIS is associated with a second signal different than the first signal, at least because the BLC structure is associated with a non-uniform thickness.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for forming a black level correction (BLC) structure are provided herein. For example, a BLC structure is provided such that no step up is associated with the BLC structure. Accordingly, the BLC structure exhibited improved performance with respect to color filter processes, at least because the BLC structure does not comprise any step up height, for example. Additionally, color ratio or color shading is improved, as a result of the BLC structure not comprising the step up. Accordingly, the BLC structure provided comprises a first region, a second region, and a third region. In some embodiments, the second region is formed over at least some of the first region, and the third region is formed over at least some of the second region. Additionally, the second region comprises a first sub-region, a second sub-region, and a third sub-region. In some embodiments, the first sub-region is formed over at least some of the first region, the second sub-region is formed over at least some of the first sub-region, and the third sub-region is formed over at least some of the second sub-region. For example, the first sub-region comprises metal-silicide, the second sub-region comprises metal, and the third sub-region comprises metal-oxide. In this manner, the BLC structure is provided such that the BLC is flush with a surface of a complementary metal-oxide-semiconductor (CMOS) image sensor (CIS). Additionally, the second sub-region of the BLC comprises a reduced thickness, for example.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
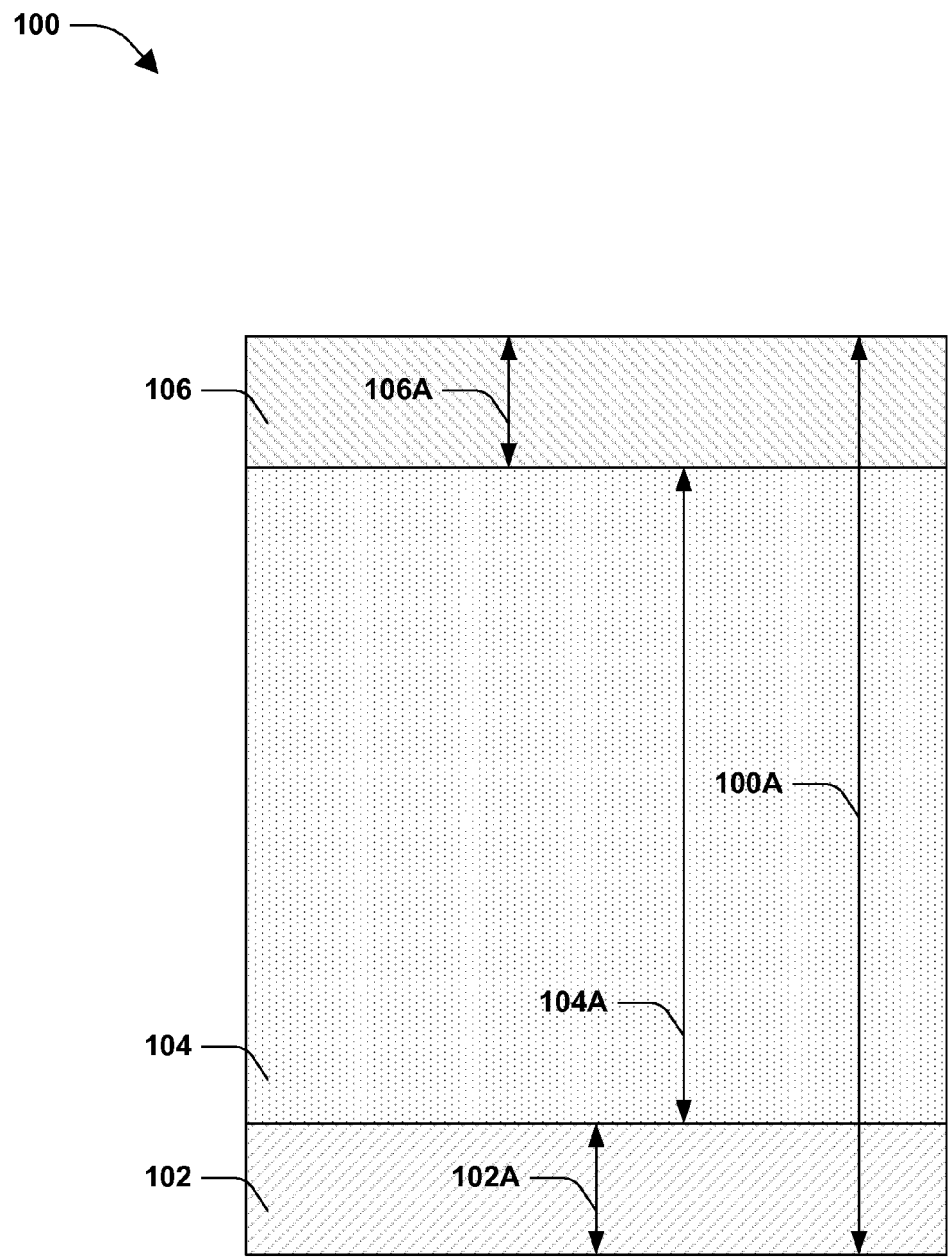
FIG. 1 is a cross-sectional view of an example sandwich structure for a black level correction (BLC) structure, according to some embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

It will be appreciated that 'layer', as used herein, contemplates a region, and may comprise a uniform thickness, but does not necessarily comprise a uniform thickness. For example, a layer is a region, such as an area comprising arbitrary boundaries. For another example, a layer is a region comprising at least some variation in thickness.

FIG. 1 is a cross-sectional view of an example sandwich structure 100 for a black level correction (BLC) structure, according to some embodiments. For example, a black level correction (BLC) structure comprises the sandwich structure 100 of FIG. 1. In some embodiments, the sandwich structure 100 comprises a first sub-region 102, a second sub-region 104, and a third sub-region 106. In some embodiments, the second sub-region 104 is formed over at least some of the first sub-region 102. Additionally, the third sub-region 106 is formed over at least some of the second sub-region 104. In some embodiments, the first sub-region 102 comprises metal-silicide, the second sub-region 104 comprises metal, and the third sub-region 106 comprises metal-oxide. For example, the metal-oxide of the third sub-region 106 is a high-k dielectric associated with a dielectric constant greater than five. Accordingly, the sandwich structure 100 is associated with a metal-silicide/metal/metal-oxide architecture, for example. It will be appreciated that the architecture of the sandwich structure 100 enables a reduction of a thickness 100A of the sandwich structure 100. In some embodiments, the sandwich structure 100 comprises a thickness 100A less than one hundred nanometers, for example. Additionally, the first sub-region 102 comprises a thickness 102A less than ten nanometers, such as five nanometers, for example. Additionally, the third sub-region 106 comprises a thickness 106A less than ten nanometers, such as four nanometers, for example. It will be appreciated that the thickness 100A of the sandwich structure 100 is the thickness 102A of the first sub-region 102 plus the thickness 104A of the second sub-region 104 plus the thickness 106A of the third sub-region 106.

In some embodiments, the sandwich structure 100 is formed by deposition, such as by metal deposition. For example, a region of metal is deposited, such as on a first region (not shown), such as a substrate region. In some embodiments, the first sub-region 102 comprising metal-silicide is formed based on performing one or more thermal processes on the deposited metal. In some embodiments, the first sub-region 102 is formed based on a precursor treatment of the first region (not shown). In some embodiments, the second sub-region 104 is formed based on deposition of the metal. In some embodiments, the third sub-region 106 is formed based on performing one or more thermal processes on the deposited metal. In some embodiments, the third sub-region 106 is formed based on treating the deposited metal with a gas, such as a pre-oxygen gas treatment on the second sub-region 104.

In some embodiments, a BLC structure comprising the sandwich structure 100 of FIG. 1 is associated with a complementary metal-oxide-semiconductor (CMOS) image sensor (CIS). For example, the CIS is a back side illumination (BSI) CIS.

It will be appreciated that FIG. 2-FIG. 8 illustrate one or more embodiments where the sandwich structure 100 of FIG. 1 is at least one of embedded, semi-embedded, or not embedded in a first region, such as a substrate region. Additionally, it will be appreciated that in some embodiments, the sandwich structure 100 is a second region, for example. Accordingly, 'sandwich structure' and 'second region' are used interchangeably, at least in some of the embodiments described herein.

Figure 2:
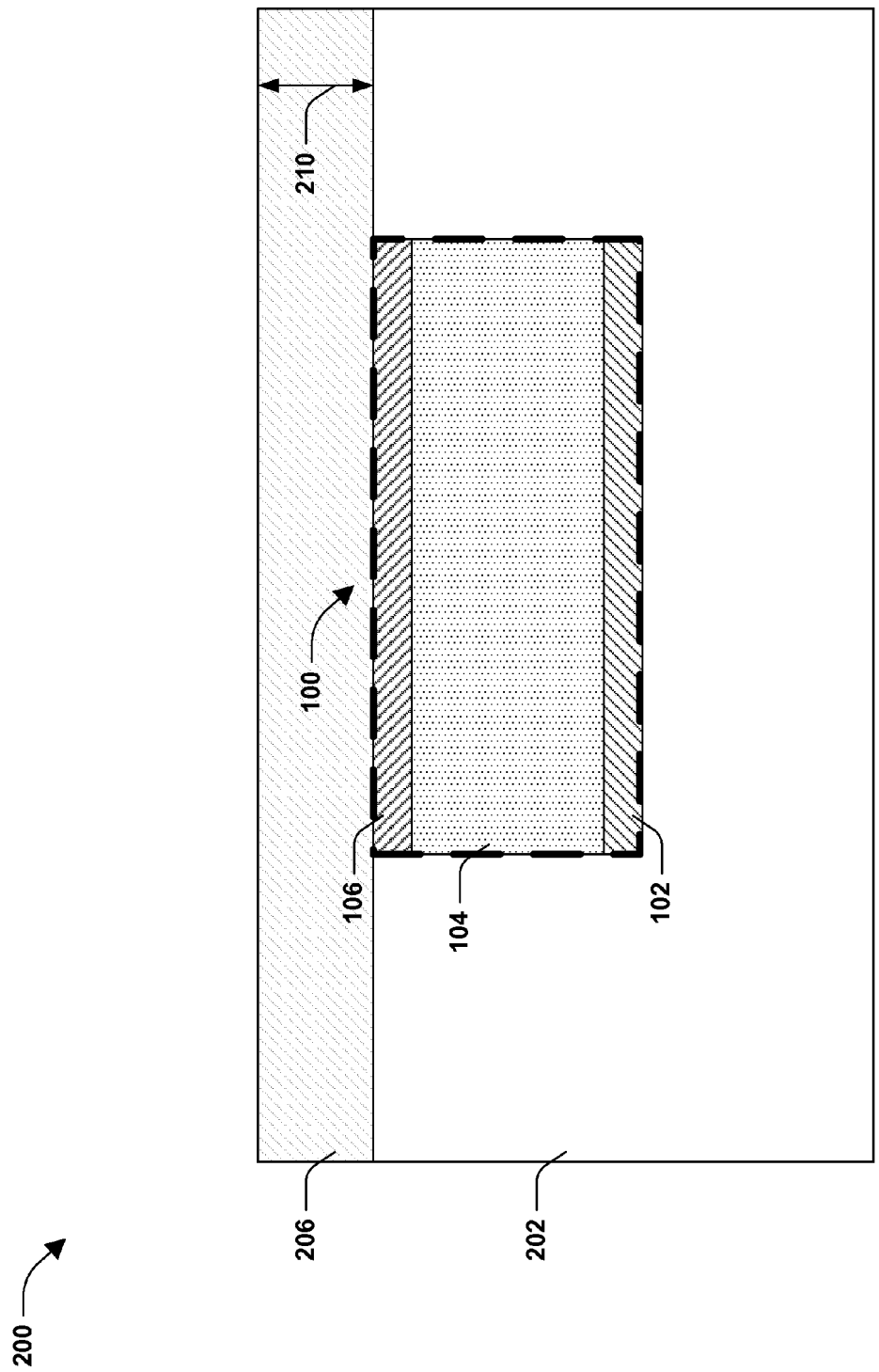
FIG. 2 is a cross-sectional view of an example black level correction (BLC) structure, according to some embodiments.

FIG. 2 is a cross-sectional view of an example black level correction (BLC) structure 200, according to some embodiments. For example, the BLC structure 200 of FIG. 2 comprises a first region 202, a second region 100, and a third region 206. In some embodiments, the second region 100 is the sandwich structure 100 of FIG. 1. Accordingly, the second region 100 comprises a first sub-region 102, a second sub-region 104, and a third sub-region 106. In some embodiments, at least some of the second region 100 is formed above at least some of the first region 202. Additionally, at least some of the third region 206 is formed above at least some of the second region 100. In some embodiments, at least some of the second sub-region 104 is formed above at least some of the first sub-region 102. In some embodiments, at least some of the third sub-region 106 is formed above at least some of the second sub-region 104. In some embodiments, at least some of the first sub-region 102 is formed above at least some of the first region 202. In some embodiments, at least some of the third region 206 is formed above at least some of the first region 202. Additionally, at least some of the third region 206 is formed above at least some of the third sub-region 106.

In some embodiments, the first region 202 comprises silicon. For example, the first region 202 is formed as a silicon substrate. In some embodiments, the second region 100 comprises the first sub-region 102, the second sub-region 104, and the third sub-region 106. For example, the first sub-region 102 comprises metal-silicide, the second sub-region 104 comprises metal, and the third sub-region 106 comprises metal-oxide. For example, the metal-silicide of the first sub-region 102 enhances interface strength between the second sub-region 104, the first sub-region 102, and the first region 202, at least because metal-silicide comprises metal and silicon, and thus shares properties with both the silicon of the first region 202 and the metal of the second sub-region 104. In this way, in-cohesion stress associated with the first sub-region 102 is mitigated. Similarly, the metal-oxide of the third sub-region 106 enhances interface strength between the second sub-region 104, the third sub-region 106, and the third region 206. In this way, in-cohesion stress associated with the third sub-region 206 is mitigated. In some embodiments, the third sub-region 106 is configured to reflect light away from at least one of the BLC structure 200, a CIS comprising the BLC structure 200, or the second sub-region 104. In some embodiments, the third sub-region 106 is a reflective region comprising a high-k dielectric configured to mitigate light from entering the BLC structure 200. According to some aspects, a dielectric constant of the third sub-region 106 is greater than five.

In some embodiments, the second region 100 comprises a metal-silicide/metal/metal-oxide sandwich architecture or a sandwich formation, for example. It will be appreciated that the sandwich architecture or sandwich formation of the second region 100 enables a thickness of the second region 100, such as 100A of FIG. 1, to be reduced to less than one hundred nanometers, such as fifty nanometers, for example. Accordingly, in some embodiments, a thickness associated with the first sub-region 102, such as 102A of FIG. 1 is less than twenty nanometers, such as five nanometers. Additionally, a thickness associated with the third sub-region 106, such as 106A of FIG. 1 is less than ten nanometers, such as four nanometers, for example. In some embodiments, the third region 206 comprises passivation dielectric. In some embodiments, the third region 206 is associated with a thickness 210. Additionally, the third region 206 comprises one or more pass regions in some embodiments.

In some embodiments, the first region 202 is formed of a silicon substrate. Additionally, the first region 202 is smoothed based on chemical-mechanical planarization (CMP), for example. According to some aspects, the second region 100 is embedded in the first region 202 such that the third region 206 is flush with the first region 202 and the second region 100. Therefore, at least some of the second region 100 is embedded in the first region 202. Accordingly, the BLC structure 200 of FIG. 2 is formed by etching a space for the second region 100 within the first region 202. For example, a depth associated with the etching is equal to a thickness of the sandwich structure 100. In some embodiments, the second region 100 is formed by depositing metal in the etched space, for example. For example, the space is etched for the second region 100 based on a dry etch. In some embodiments, at least some of the second region 100 is formed in at least some of the etched space. For example, the second region 100 is formed based on deposition, such as deposition of metal on a silicon substrate of the first region 202. In some embodiments, the first sub-region 102 of the second region 100 is formed based on at least one of a thermal process, a sequential thermal process, a plasma process, or a precursor treatment. For example, the precursor treatment is applied to the silicon of the first region 202. In some embodiments, the second sub-region 104 is formed based on deposition, and is formed during formation of the second region 100. In some embodiments, the second region 100 is formed of metal such that the first sub-region 102, the second sub-region 104, and the third sub-region 106 comprise metal. In this example, the first sub-region 102 and the third sub-region 106 are processed or treated to become metal-silicide and metal-oxide, respectively. In some embodiments, the third sub-region is formed based on at least one of a thermal process, a sequential thermal process, a plasma process, or a pre-oxygen gas treatment. For example, the pre-oxygen gas treatment is applied to the metal of the second sub-region 104.

In some embodiments, the BLC structure 200 of FIG. 2 is associated with a complementary metal-oxide-semiconductor (CMOS) image sensor (CIS). In some embodiments, the BLC structure 200 does not comprise a step up or step up height, thus providing at least one of a flush surface or a flat topography. For example, the BLC structure 200 facilitates at least one of a flush surface or a flat topography for the CIS, at least because the sandwich structure 100 does not protrude through the third region 206. Additionally, it will be appreciated that the BLC structure 200 is associated with a reduced thickness, at least because the sandwich structure 100 of the BLC structure 200 comprises a thickness of less than one hundred nanometers, such as fifty nanometers, for example.

Accordingly, the BLC structure 200 is associated with at least one of an improved color filter process, light transfer efficiency, uniformity in thickness, color process, color ratio, color shading, etc. In some embodiments, the BLC structure 200 of FIG. 2 is used in a back side illumination (BSI) sensor. In some embodiments, at least some of the second region 100 is grounded to the first region 202. For example, grounding metal, such as metal of the second sub-region 104 to the silicon substrate of the first region 202 enables accumulated charge to be released, thus mitigating dark current.

Figure 3:
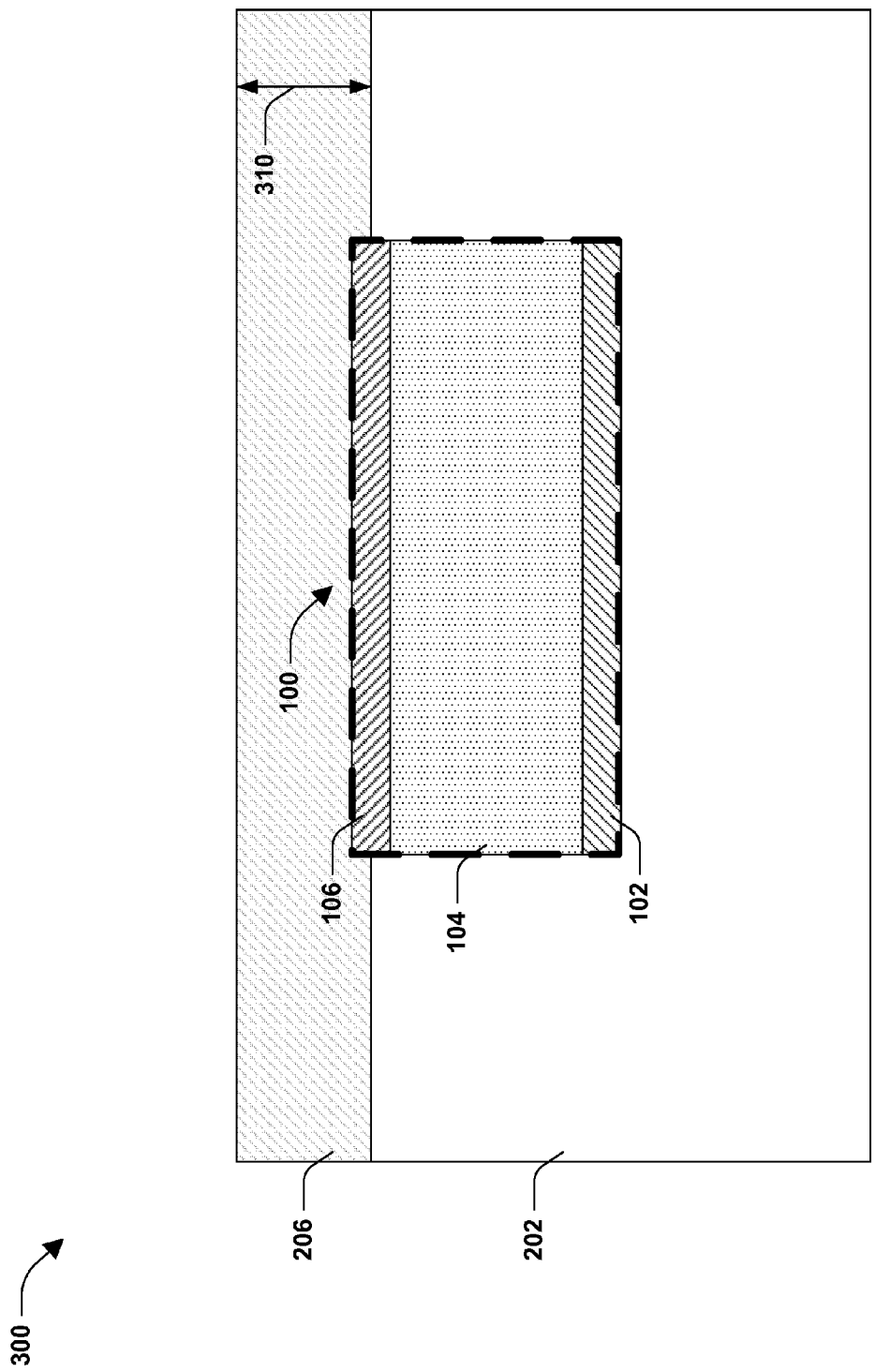
FIG. 3 is a cross-sectional view of an example black level correction (BLC) structure, according to some embodiments.

FIG. 3 is a cross-sectional view of an example black level correction (BLC) structure 300, according to some embodiments. For example, the BLC structure 300 of FIG. 3 is similar to the BLC structure 200 of FIG. 2, except that the sandwich structure 100 of the BLC structure 300 of FIG. 3 is semi-embedded in the first region 202. According to some embodiments, at least some of the third sub-region 106 is embedded in the first region 202. Additionally, a thickness 310 of the third region 206 of the BLC structure 300 of FIG. 3 is greater than the thickness 210 of the third region 206 of the BLC structure 200 of FIG. 2.

Figure 4:
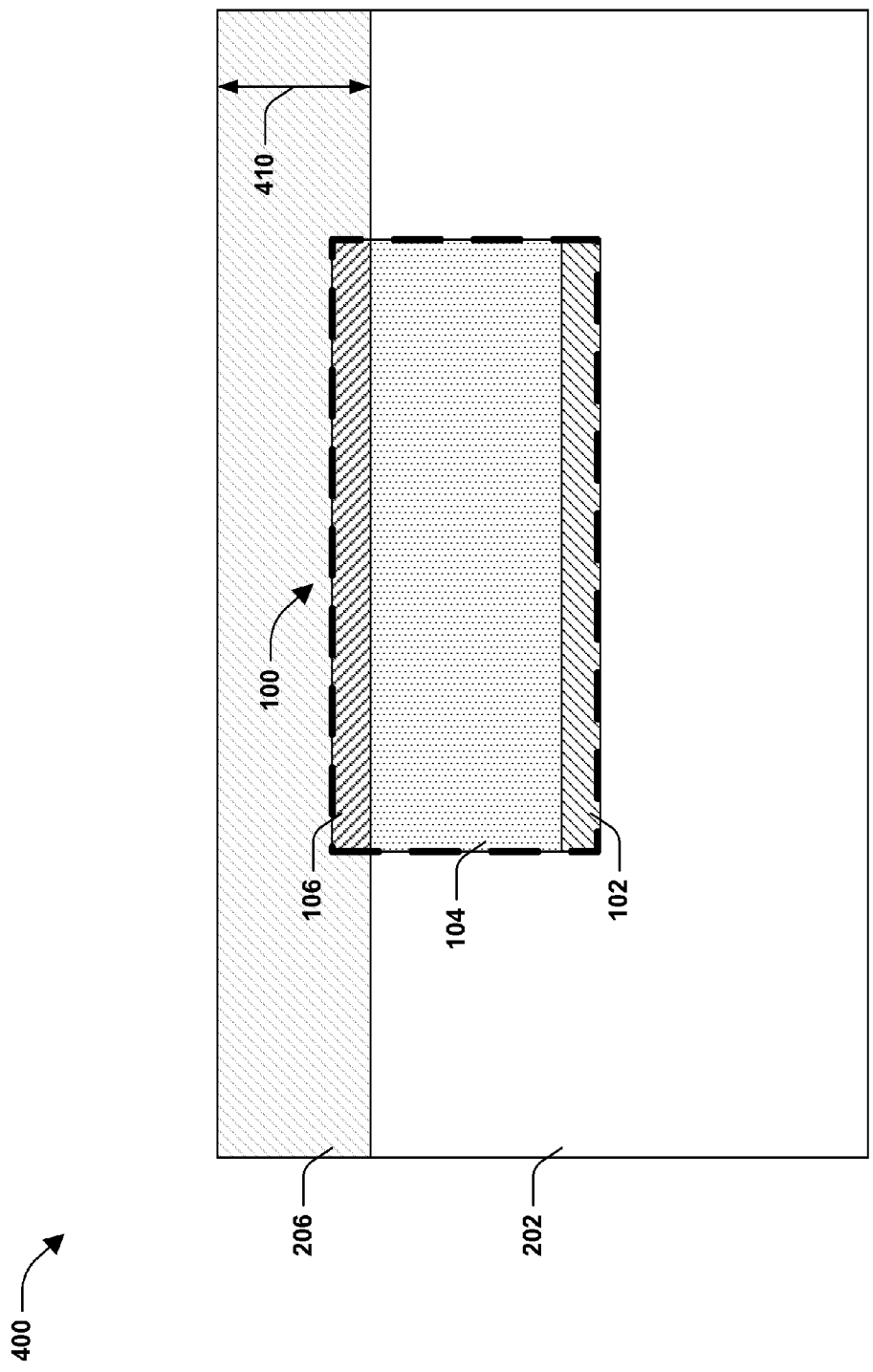
FIG. 4 is a cross-sectional view of an example black level correction (BLC) structure, according to some embodiments.

FIG. 4 is a cross-sectional view of an example black level correction (BLC) structure 400, according to some embodiments. For example, the BLC structure 400 of FIG. 4 is similar to the BLC structure 300 of FIG. 3. In some embodiments, merely the first sub-region 102 and the second sub-region 104 are embedded in the first region 202. Additionally, a thickness 410 of the third region 206 of the BLC structure 400 of FIG. 4 is greater than the thickness 310 of the third region 206 of the BLC structure 300 of FIG. 3.

Figure 5:
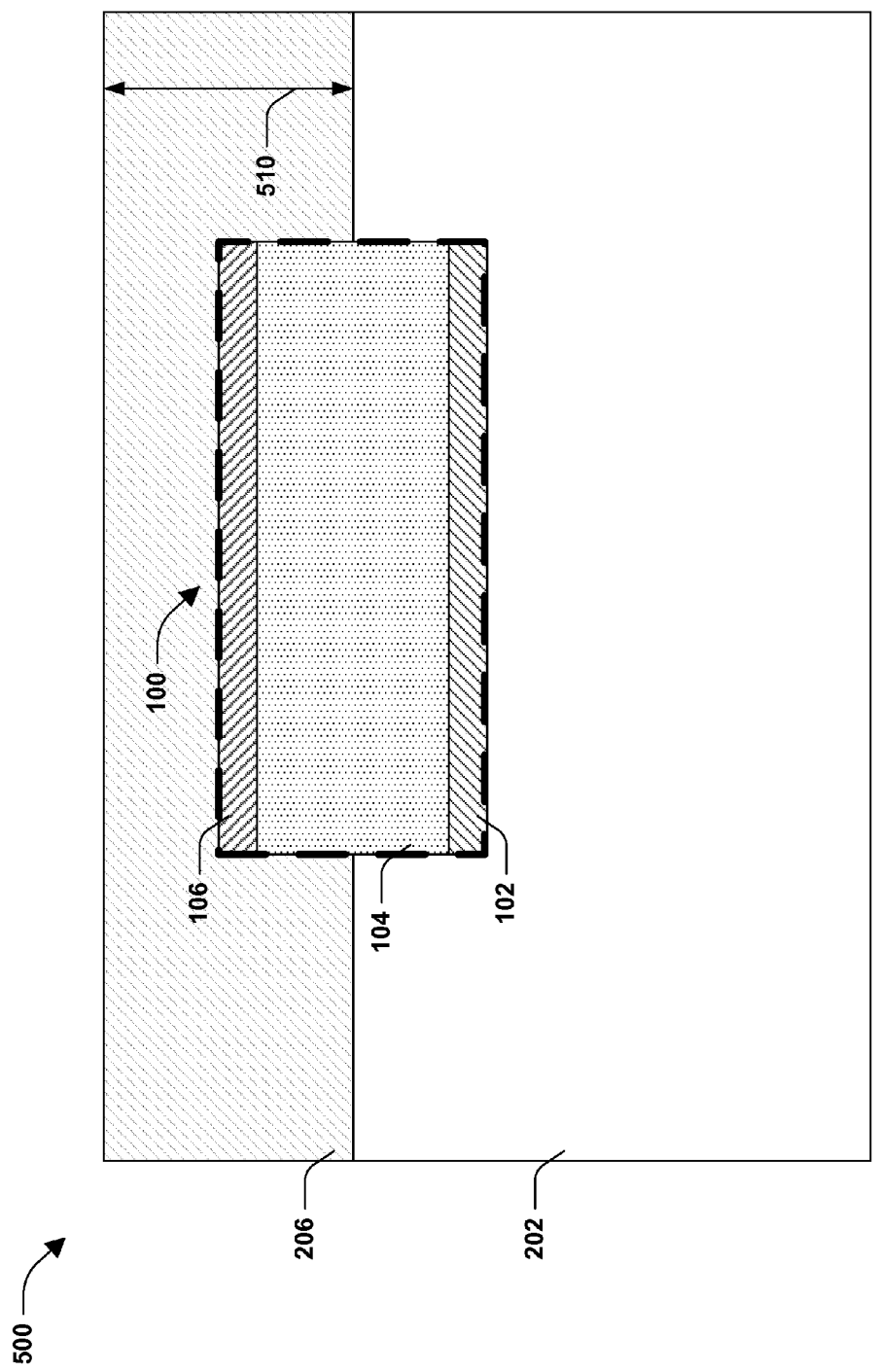
FIG. 5 is a cross-sectional view of an example black level correction (BLC) structure, according to some embodiments.

FIG. 5 is a cross-sectional view of an example black level correction (BLC) structure 500, according to some embodiments. For example, the BLC structure 500 of FIG. 5 is similar to the BLC structure 400 of FIG. 4. In some embodiments, at least some of the second sub-region 104 is embedded in the first region 202. Additionally, a thickness 510 of the third region 206 of the BLC structure 500 of FIG. 5 is greater than the thickness 410 of the third region 206 of the BLC structure 400 of FIG. 4.

Figure 6:
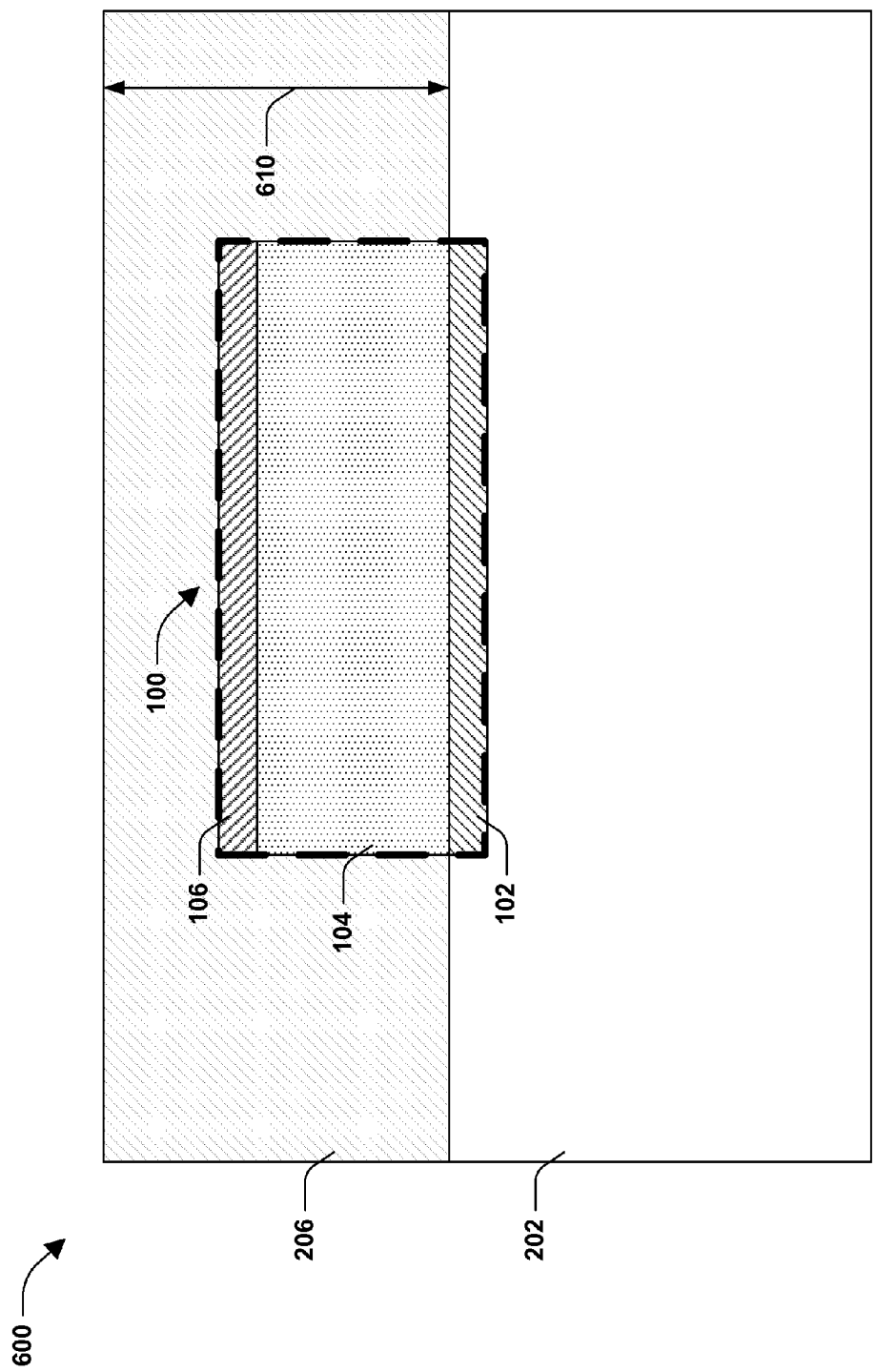
FIG. 6 is a cross-sectional view of an example black level correction (BLC) structure, according to some embodiments.

FIG. 6 is a cross-sectional view of an example black level correction (BLC) structure 600, according to some embodiments. For example, the BLC structure 600 of FIG. 6 is similar to the BLC structure 500 of FIG. 5. In some embodiments, merely the first sub-region 102 is embedded in the first region 202. Additionally, a thickness 610 of the third region 206 of the BLC structure 600 of FIG. 6 is greater than the thickness 510 of the third region 206 of the BLC structure 500 of FIG. 5.

Figure 7:
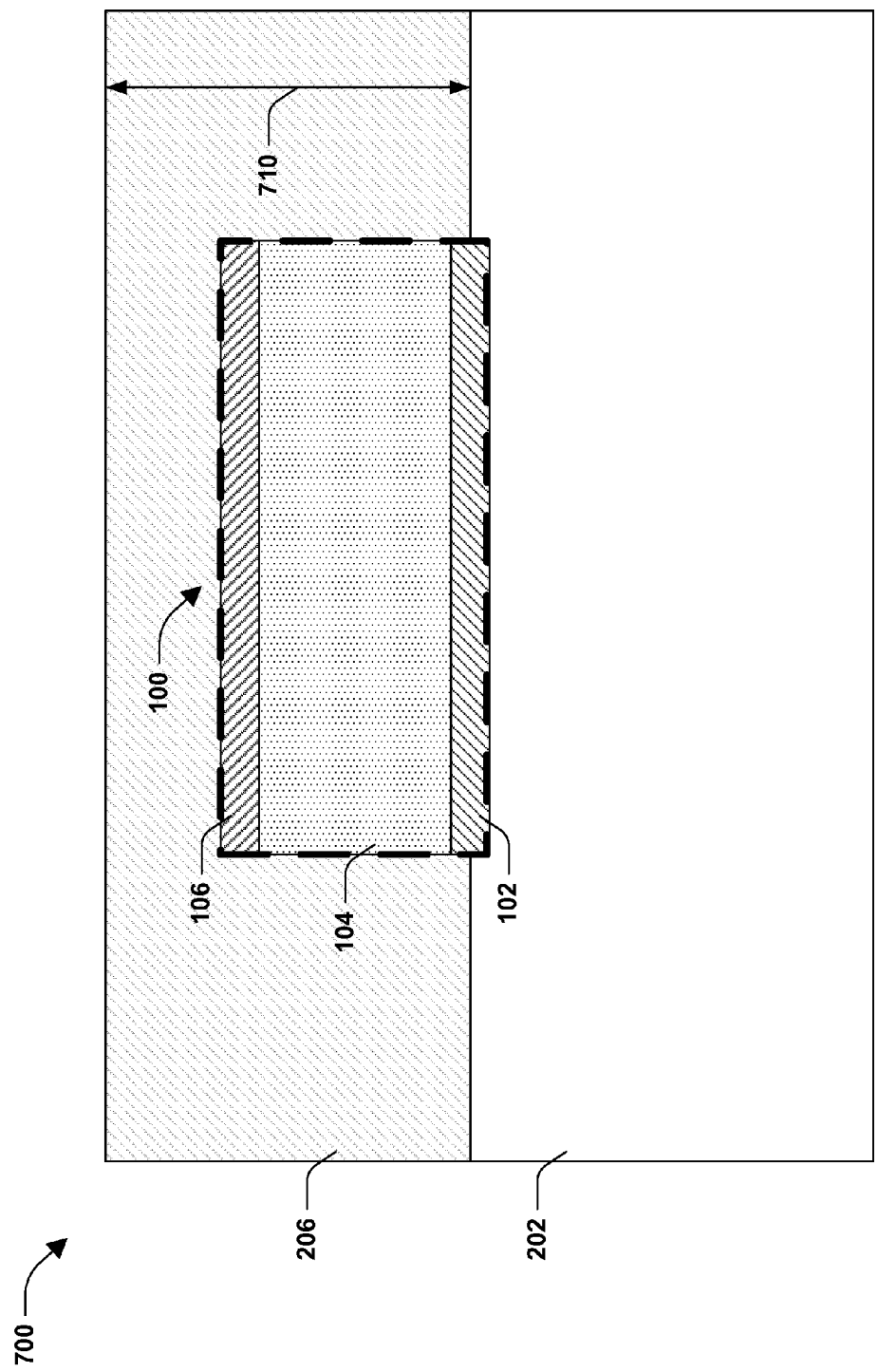
FIG. 7 is a cross-sectional view of an example black level correction (BLC) structure, according to some embodiments.

FIG. 7 is a cross-sectional view of an example black level correction (BLC) structure 700, according to some embodiments. For example, the BLC structure 700 of FIG. 7 is similar to the BLC structure 600 of FIG. 6. In some embodiments, at least some of the first sub-region 102 is embedded in the first region 202. Additionally, a thickness 710 of the third region 206 of the BLC structure 700 of FIG. 7 is greater than the thickness 610 of the third region 206 of the BLC structure 600 of FIG. 6. In some embodiments, at least some of the third region 206 is formed to surround a side of at least one of the first sub-region 102, the second sub-region 104, or the third sub-region 106. For example, the third region 206 is in contact with the wall of at least one of the first sub-region 102, the second sub-region 104, or the third sub-region 106, such that a vertical interface is formed between the third region 206 and the respective sub-regions of the second region 100.

Figure 8:
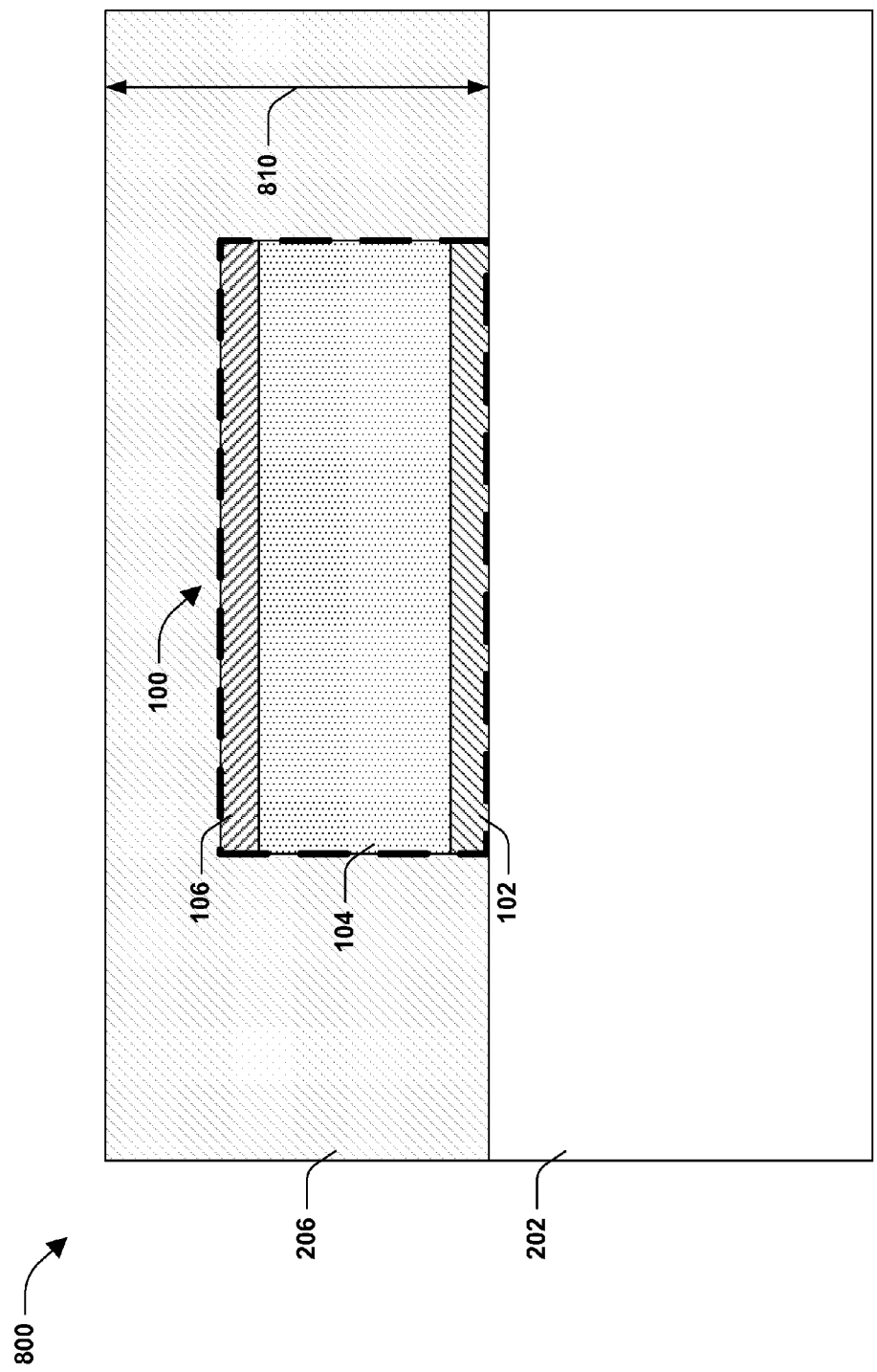
FIG. 8 is a cross-sectional view of an example black level correction (BLC) structure, according to some embodiments.

It will be appreciated that FIG. 2-FIG. 7 are associated with etching of a first region 202, while FIG. 8 is not associated with etching of the first region 202, at least because the second region 100 of FIG. 8 is not embedded in the first region 202. Accordingly, FIG. 8 is a cross-sectional view of an example black level correction (BLC) structure 800, according to some embodiments. For example, the BLC structure 800 of FIG. 8 is similar to the BLC structure 700 of FIG. 7, except that the sandwich structure 100 of the BLC structure 800 of FIG. 8 is not embedded in the first region 202. Accordingly, the first sub-region 102, the second sub-region 104, and the third sub-region 106 are not embedded in the first region 202. Additionally, a thickness 810 of the third region 206 of the BLC structure 800 of FIG. 8 is greater than the thickness 710 of the third region 206 of the BLC structure 700 of FIG. 7.

Figure 9:
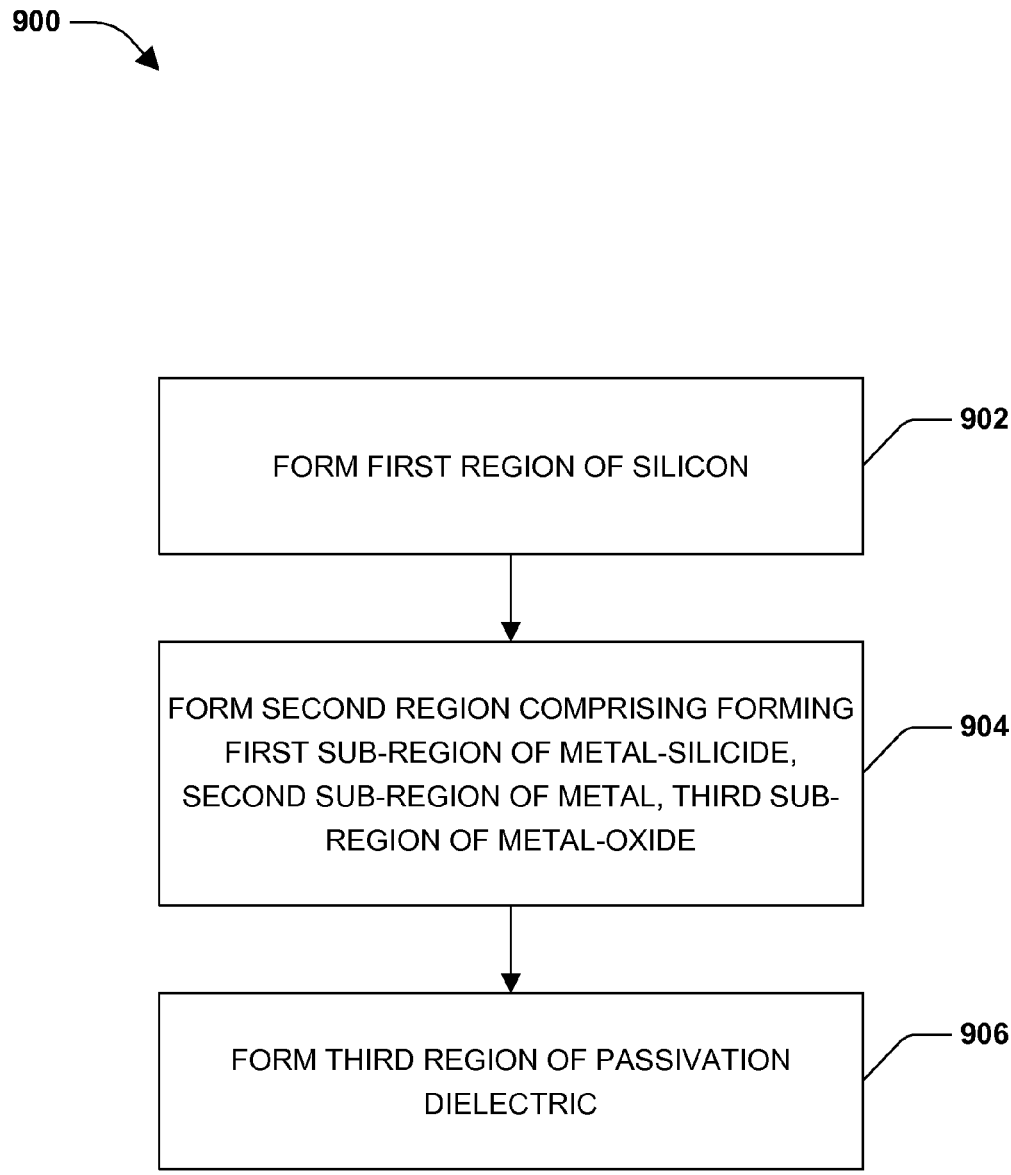
FIG. 9 is a flow diagram of an example method for forming a black level correction (BLC) structure, according to some embodiments.

FIG. 9 is a flow diagram of an example method 900 for forming a black level correction (BLC) structure, according to some embodiments. In some embodiments, the method 900 comprises forming a first region of silicon at 902. In some embodiments, forming the first region comprises etching a space for the second region within the first region. For example, the second region is formed in at least some of the etched space. In some embodiments, etching the space for the second region is based on a dry etch. At 904, a second region is formed. For example, forming the second region comprises forming a first sub-region comprising metal-silicide based on a metal over at least some of the first region, forming a second sub-region comprising the metal over at least some of the first sub-region, and forming a third sub-region comprising metal-oxide based on the metal over at least some of the second sub-region. In some embodiments, the first sub-region is formed based on at least one of a thermal process or a precursor treatment. Additionally, forming the second sub-region is based on deposition, such as metal deposition on a substrate. In some embodiments, the third sub-region is formed by at least one of a thermal process or a pre-oxygen gas treatment to the second sub-region. At 906, the method 900 comprises forming a third region comprising passivation dielectric over at least some of the third sub-region.

Figure 10:
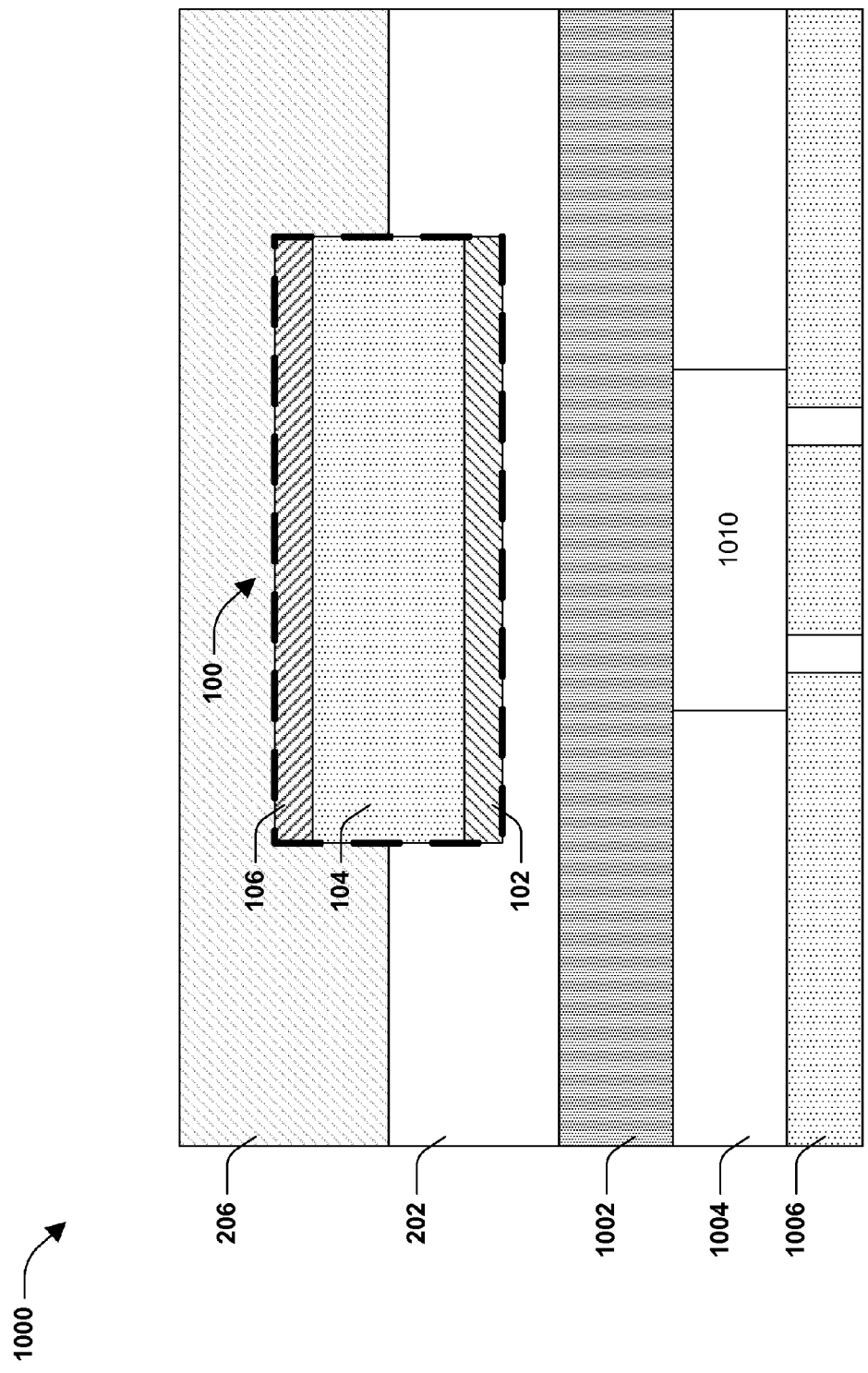
FIG. 10 is a cross-sectional view of an example image sensor associated with a black level correction (BLC) structure, according to some embodiments.

FIG. 10 is a cross-sectional view of an example image sensor 1000 comprising a black level correction (BLC) structure, according to some embodiments. In some embodiments, the image sensor 1000 comprises a BLC structure, such as a sandwich structure 100, for example. In some embodiments, the sandwich structure 100 is similar to the sandwich structure 100 of FIG. 2. In some embodiments, the image sensor 1000 comprises a first region 202, a second region 100, and a third region 206. In some embodiments, the second region 100 is the sandwich structure 100 of FIG. 2. In some embodiments, the second region 100 comprises a first sub-region 102, a second sub-region 104, and a third sub-region 106. In some embodiments, at least some of the second region 100 is formed above at least some of the first region 202, at least some of the third region 206 is formed above at least some of the second region 100, at least some of the second sub-region 104 is formed above at least some of the first sub-region 102, at least some of the third sub-region 106 is formed above at least some of the second sub-region 104, at least some of the first sub-region 102 is formed above at least some of the first region 202, at least some of the third region 206 is formed above at least some of the first region 202, or at least some of the third region 206 is formed above at least some of the third sub-region 106. In some embodiments, the first region 202 is formed above an inter-layer region 1002. In some embodiments the inter-layer region 1002 is formed above an inter-metal region 1004. In some embodiments, the inter-metal region 1004 is formed above a base region 1006. In some embodiments, an interconnect 1010 is formed between the inter-layer region 1002 and the base region 1006. For example, the interconnect 1010 is formed within the inter-metal region 1004.

In some embodiments, the first region 202 comprises silicon, the first sub-region 102 comprises metal-silicide, the second sub-region 104 comprises metal, and the third sub-region 106 comprises metal-oxide. In some embodiments, the inter-layer region 1002 comprises dielectric and the inter-metal region 1004 comprises dielectric. In some embodiments, the interconnect 1010 comprises metal.

According to some aspects, a black level correction (BLC) structure is provided, comprising a first region comprising silicon. In some embodiments, the BLC structure comprises a second region. For example, the second region comprises a first sub-region comprising metal-silicide, where at least some of the first sub-region is above at least some of the first region. Additionally, the second region comprises a second sub-region comprising metal, where at least some of the second sub-region is above at least some of the first sub-region. Additionally the second region comprises a third sub-region comprising metal-oxide, where at least some of the third sub-region is above at least some of the second sub-region. In some embodiments, the BLC structure comprises a third region comprising passivation dielectric, where at least some of the third region is above at least some of the second region.

According to some aspects, an image sensor associated with a black level correction (BLC) structure is provided, comprising a base region. In some embodiments, the image sensor comprises an inter-metal region above the base region and an inter-layer region above the inter-metal region. In some embodiments, the image sensor comprises an interconnect within the inter-metal region, the interconnect between the base region and the inter-layer region. Additionally, the image sensor comprises a first region comprising silicon, the first region above the inter-layer region, a second region, and a third region comprising passivation dielectric, at least some of the third region above at least some of the second region. In some embodiments, the second region comprises a first sub-region comprising metal-silicide, at least some of the first sub-region above at least some of the first region. In some embodiments, the second region comprises a second sub-region comprising metal, at least some of the second sub-region above at least some of the first sub-region. In some embodiments, the second region comprises a third sub-region comprising metal-oxide, at least some of the third sub-region above at least some of the second sub-region.

According to some aspects, a black level correction (BLC) structure is provided, comprising a first region comprising silicon. Additionally, the BLC structure comprises a second region. For example, the second region comprises a first sub-region comprising metal-silicide. In some embodiments, at least some of the first sub-region is embedded in the first region. Additionally, the second region comprises a second sub-region comprising metal. In some embodiments, at least some of the second sub-region is above at least some of the first sub-region. Additionally, the second region comprises a third sub-region comprising metal-oxide. In some embodiments, at least some of the third sub-region is above at least some of the second sub-region. In some embodiments, the BLC structure comprises a third region comprising passivation dielectric. For example, at least some of the third region is above at least some of the second region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the first region, the second region, the third region, the first sub-region, the second sub-region, the third sub-region, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as implanting techniques, doping techniques, spin-on techniques, sputtering techniques such as magnetron or ion beam sputtering, precursor treatment, gas treatment, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. An image sensor associated with a black level correction (BLC) structure, the BLC structure comprising:
    a first layer comprising silicon;
    a region comprising:
        a second layer comprising metal-silicide, at least some of the second layer above at least some of the first layer;
        a third layer comprising metal, at least some of the third layer above the second layer; and
        a fourth layer comprising metal-oxide, at least some of the fourth layer above an uppermost surface of the third layer; and
    a fifth layer comprising passivation dielectric, at least some of the fifth layer above at least some of the fourth layer and the fifth layer in direct physical contact with at least some of a top surface of the fourth layer so as to form a lateral interface with the fourth layer.

2. The image of sensor of claim 1, the fourth layer configured to reflect light from the BLC structure.

3. The image of sensor of claim 1, at least some of a sidewall of the third layer in direct physical contact with the first layer.

4. The image of sensor of claim 1, the metal-oxide associated with a dielectric constant greater than five.

5. The image of sensor of claim 1, at least some of a sidewall of the fourth layer in direct physical contact with the first layer.

6. The image of sensor of claim 1, at least some of the second layer embedded in the first layer.

7. The image of sensor of claim 1, at least some of the third layer embedded in the first layer.

8. The image of sensor of claim 1, at least some of the fourth layer embedded in the first layer.

9. The image of sensor of claim 1, at least some of a sidewall of the second layer in direct physical contact with the fifth layer.

10. The image of sensor of claim 1, at least some of the fifth layer surrounding at least some of a side of at least one of the second layer, the third layer, or the fourth layer.

11. An image sensor associated with a black level correction (BLC) structure, the BLC structure comprising:
    a first layer comprising silicon;
    a region comprising:
        a second layer comprising metal-silicide, at least some of the second layer above at least some of the first layer;
        a third layer comprising metal, at least some of the third layer above the second layer and in direct physical contact with the second layer and at least some of a sidewall of the third layer in direct physical contact with the first layer; and
        a fourth layer comprising metal-oxide, at least some of the fourth layer above the third layer; and
    a fifth layer comprising passivation dielectric, at least some of the fifth layer above the fourth layer.

12. The image sensor of claim 11, at least some of the fifth layer laterally co-planar with the third layer.

13. The image sensor of claim 11, at least some of a sidewall of the fourth layer in direct physical contact with the first layer.

14. The image sensor of claim 11, the fifth layer in direct physical contact with at least some of a top surface of the fourth layer.

15. The image sensor of claim 11, at least some of the region embedded in the first layer.

16. The image sensor of claim 11, at least some of the second layer embedded in the first layer.

17. The image sensor of claim 11, at least some of the third layer embedded in the first layer.

18. The image sensor of claim 11, at least some of the-sidewall of the third layer in direct physical contact with the fifth layer.

19. The image sensor of claim 11, at least some of the fifth layer over the first layer.

20. An image sensor associated with a black level correction (BLC) structure, the BLC structure comprising:
    a first layer comprising silicon;
    a region comprising:
        a second layer comprising metal-silicide, at least some of the second layer embedded in the first layer;
        a third layer comprising metal, at least some of the third layer above at least some of the second layer; and
        a fourth layer comprising metal-oxide, at least some of the fourth layer above at least some of the third layer; and
    a fifth layer comprising passivation dielectric, at least some of the fifth layer above at least some of the fourth layer, and at least some of a sidewall of the second layer in direct physical contact with the fifth layer.

* * * * *